(12) United States Patent
Porter

(10) Patent No.: US 11,899,045 B2
(45) Date of Patent: Feb. 13, 2024

(54) SYSTEM VOLTAGE CALIBRATION

(71) Applicant: S&C Electric Company, Chicago, IL (US)

(72) Inventor: David G. Porter, East Troy, WI (US)

(73) Assignee: S&C Electric Company, Chicago, IL (US)

(*) Notice: Subject to any disclaimer, the term of this patent is extended or adjusted under 35 U.S.C. 154(b) by 205 days.

(21) Appl. No.: 17/715,378

(22) Filed: Apr. 7, 2022

(65) Prior Publication Data

US 2023/0009953 A1 Jan. 12, 2023

Related U.S. Application Data

(60) Provisional application No. 63/220,292, filed on Jul. 9, 2021.

(51) Int. Cl.
*G01R 15/16* (2006.01)
*G01R 35/00* (2006.01)

(52) U.S. Cl.
CPC .......... *G01R 15/16* (2013.01); *G01R 35/005* (2013.01)

(58) Field of Classification Search
CPC ........ G01R 15/16; G01R 35/005; G01R 1/00; G01R 3/00; G01R 5/00; G01R 7/00; G01R 9/00; G01R 11/00; G01R 13/00; G01R 15/00; G01R 17/00; G01R 19/00; G01R 22/00; G01R 21/00; G01R 23/00; G01R 25/00; G01R 27/00; G01R 29/00; G01R 31/00; G01R 33/00; G01R 35/00
See application file for complete search history.

(56) References Cited

U.S. PATENT DOCUMENTS

| | | | |
|---|---|---|---|
| 2013/0128396 A1* | 5/2013 | Danesh | G01R 23/02 361/45 |
| 2017/0148159 A1* | 5/2017 | Wang | G01R 15/06 |
| 2019/0181851 A1* | 6/2019 | Landes | H01H 3/54 |

\* cited by examiner

*Primary Examiner* — Alexander Satanovsky
*Assistant Examiner* — Brent J Andrews

(57) ABSTRACT

A system and method for calibrating a capacitor voltage sensor that measures voltage on a power line coupled through a switch to a primary coil of a transformer. The method includes measuring a control voltage on a secondary coil of the transformer and measuring voltage on the capacitor sensor when the switch is known to be closed. The method identifies a calibration factor that when multiplied by the measured voltage on the capacitor sensor when the switch is closed makes the measured voltage on the capacitor sensor substantially equal to the control voltage. The method subsequently measures voltage on the capacitor sensor when the switch is open or closed during operation of the transformer, and multiplies the subsequently measured voltage on the capacitor sensor when the switch is open or closed by the calibration factor to obtain a measured voltage.

20 Claims, 3 Drawing Sheets

SYSTEM VOLTAGE CALIBRATION

BACKGROUND

Field

The present disclosure relates generally to a system and method for calibrating a capacitor voltage sensor and, more particularly, to a system and method for calibrating a capacitor voltage sensor that measures medium voltage and is employed in a bushing well interrupter (BWI) associated with a transformer in a loop circuit.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single phase lateral lines are tapped off of the feeder that provide the medium voltage to various distribution transformers, where the voltage is stepped down to a low voltage and is provided to a number of loads, such as homes, businesses, etc.

Some power distribution networks may employ a number of underground single-phase lateral circuits that feed residential and commercial customers. Often times these circuits are configured in a loop and fed from power sources at both ends, where an open circuit location in the loop isolates the two power sources. Transformers are dispersed along the loop that each service a number of loads, where the open circuit location is typically provided at one of the transformers. A single-phase line is coupled to the primary coil in each transformer so that current flows to the primary coils along the loop. It has been proposed in the art to provide a switching device at the source side and the load side of each transformer between the primary coil and the line that includes, for example, a vacuum interrupter. The two switching devices in each transformer can be controlled by a common control unit that provides fault isolation and power restoration in response to a fault in the line.

In one loop circuit design, the switching devices employ capacitor sensors that measure voltage on the line to provide signals necessary for the fault isolation and power restoration process, and otherwise, where the accuracy of the voltage measurements is important, and where the capacitor sensors may be required to measure two or more normal medium voltages, for example, 13200V and 7260V. However, these types of capacitor sensors typically have an accuracy of ±10%, which is generally not good enough for determining that the system has returned to a normal voltage and the circuit can be returned to its normal configuration after going through the fault isolation and restoration process.

The traditional technique for addressing this issue is to calibrate the accuracy of the capacitor voltage sensors in the manufacturing facility, which only solves part of the problem since the medium voltage for the particular application of the switching device is unknown. A common solution to not knowing the application voltage is to configure the controller so that the calibrated capacitor sensor is multiplied by a configured voltage ratio to get the nominal voltage on which the controls can calculate over and under voltage trip parameters. However, it may be desirable to transport the control unit separately from the capacitor voltage sensors to then be assembled in the transformer. In this case it is not desirable to calibrate the capacitor sensors as that would require either a memory device to transfer the calibration value to the control unit, or a manual transfer of the calibration value to the control unit through an interface. In addition, it is not desirable to transfer the application voltage to the control unit as a field setup. Therefore, what is needed is a method to self-calibrate capacitor voltage sensors without requiring the primary voltage.

SUMMARY

The following discussion discloses and describes a system and method for calibrating a capacitor voltage sensor that measures voltage on a power line coupled through a switch to a primary coil of a transformer. The method includes measuring a control voltage on a secondary coil of the transformer and measuring voltage on the capacitor sensor when the switch is known to be closed and the voltage on the primary coil is the same as the voltage on the power line. The method identifies a calibration factor that when multiplied by the measured voltage on the capacitor sensor when the switch is closed makes the measured voltage on the capacitor sensor substantially equal to the control voltage. The method subsequently measures voltage on the capacitor sensor when the switch is open or closed during operation of the transformer, and multiplies the subsequently measured voltage on the capacitor sensor when the switch is open or closed by the calibration factor to obtain a measured voltage.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a system and method for calibrating a medium voltage capacitor sensor employed in a BWI associated with a transformer in a loop circuit is merely exemplary in nature, and is in no way intended to limit the invention or its applications or uses. For example, as mentioned, the system and method have particular application for use in a residential loop circuit. However, the system and method may have other applications.

Figure 1:
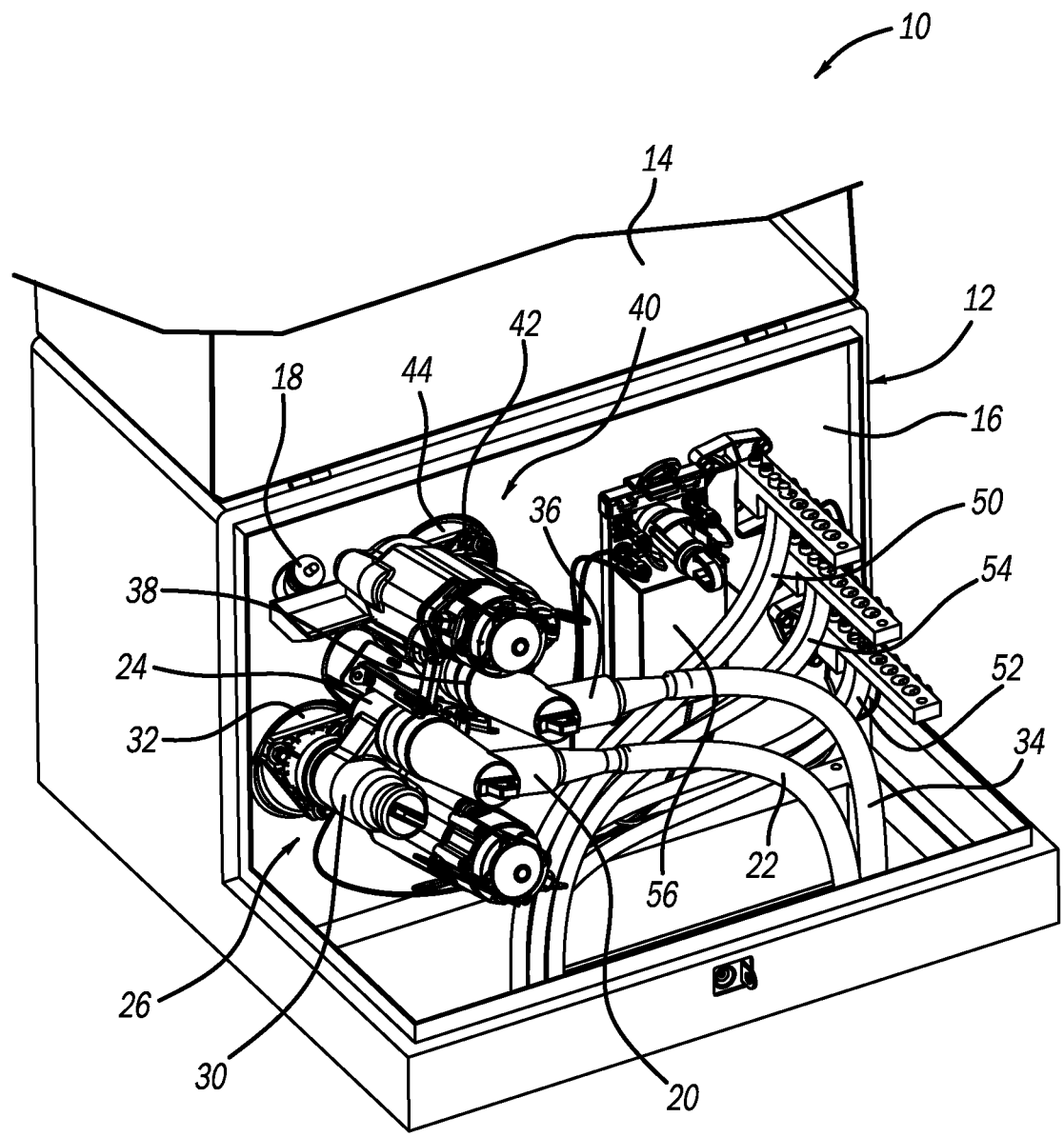
FIG. 1 is an isometric view of a pad-mounted transformer.

FIG. 1 is an isometric view of a transformer 10, which is the type that is mounted on a pad (not shown). It is noted that the configuration of the transformer 10 is merely for illustrative purposes in that other configurations would be applicable consistent with the discussion herein. The transformer 10 includes an enclosure 12 that houses the primary and secondary coils and other electrical components (not shown in FIG. 1) of the transformer 10. A cover 14 of the enclosure 12 is shown in an open position to expose a panel 16 in the enclosure 12. An elbow connector 20 is connected to a medium voltage power line cable 22 and a load-break interface 24 of a bushing well interrupter (BWI) 26. A transformer interface 30 of the BWI 26 is connected to a connector bushing 32 that extends through the panel 16 and is coupled through a fuse 18 to the primary coil to connect the cable 22 to the primary coil through the BWI 26 on the source side of the transformer 10. Likewise, an elbow connector 36 is connected to a power line cable 34 and a load-break interface 38 of a BWI 40. A transformer interface 42 of the BWI 40 is connected to a connector bushing 44 that extends through the panel 16 and is coupled through the fuse 18 to the primary coil to connect the cable 34 to the primary coil through the BWI 40 on the load side of the transformer 10. A number of positive and negative 120 V lines 50 and 52 and a neutral line 54 are connected to the secondary coil, extend from the enclosure 12 and provide power to a service conductor (not shown), where the number of the lines 50 and 52 depends on the number and type of the loads being serviced by the transformer 10. A control unit 56 controls the BWIs 26 and 40 as will be discussed in certain detail below.

Figure 2:
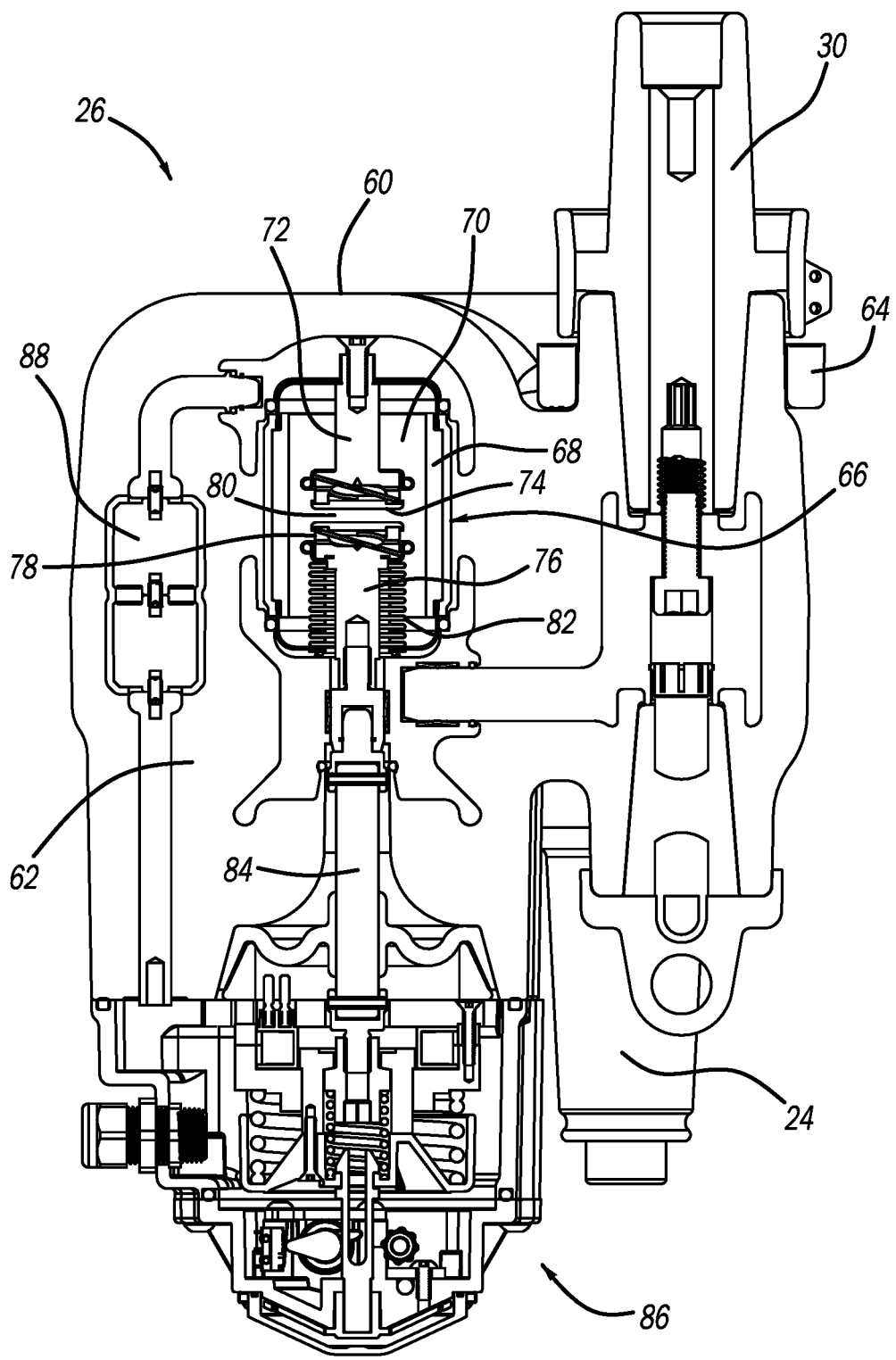
FIG. 2 is a cross-sectional type view of a BWI in the transformer shown in FIG. 1.

FIG. 2 is a cross-sectional view of the BWI 26 showing one non-limiting example merely for illustrative purposes. The BWI 26 includes an outer enclosure 60, the transformer interface 30 and the load-break connector interface 24. The components within the enclosure 60 are encapsulated within an insulating medium 62, such as an epoxy, where many of the components are conductors operating at the medium voltage potential. A Rogowski coil 64 measures current flow through the BWI 26. The BWI 26 includes a vacuum interrupter 66 having a vacuum enclosure 68 defining a vacuum chamber 70, an upper fixed terminal 72 extending through the enclosure 68 and into the chamber 70 and having a contact 74 and a lower movable terminal 76 extending through the enclosure 68 and into the chamber 70 and having a contact 78, where a gap 80 is provided between the contacts 74 and 78 when the vacuum interrupter 66 is open. A bellows 82 allows the movable terminal 76 to move without affecting the vacuum integrity of the chamber 70. The movable terminal 76 is coupled to a drive rod 84 that is coupled to an actuator assembly 86 for opening and closing the vacuum interrupter 66. Capacitors 88 provide voltage sensing and power line communications (PLC).

Figure 3:
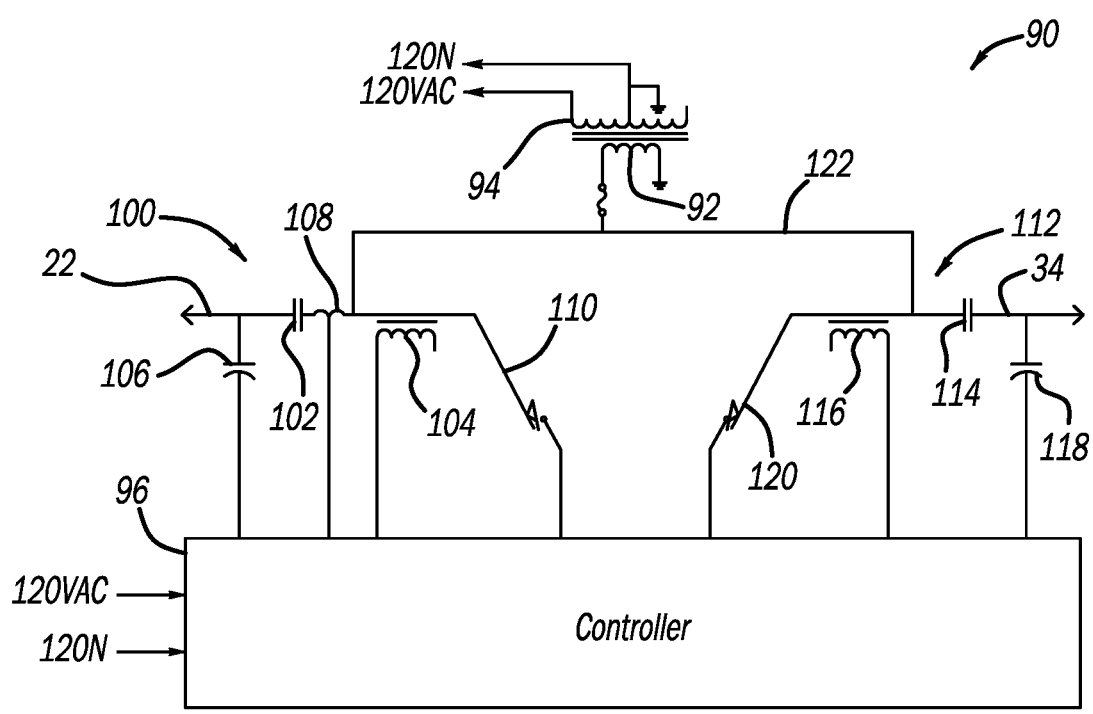
FIG. 3 is a schematic type diagram of the transformer shown in FIG. 1.

FIG. 3 is a schematic type diagram of a transformer 90 representing the transformer 10 that includes a primary coil 92 that receives the medium voltage power on power line 122 after moving through the contacts 102 from the cable 22 and a secondary coil 94 that provides 120 VAC, 120 N and 240 VAC, where the winding ratio between the primary coil 92 and the secondary coil 94 is set so as to provide 120 V by the secondary coil 94 for a nominal medium voltage on the line 122, such as 13200 V or 7620 V. The 120 VAC and 120 N also provide power to a controller 96 representing the control unit 56, which can be measured by the controller 96. A BWI 100 representing the BWI 26 includes a vacuum interrupter 102 representing the vacuum interrupter 66, an actuator 104 representing the actuator assembly 86, a high voltage capacitor 106 representing the capacitors 88, a current transformer (CT) 108 for measuring current on the cable 22 and a manual handle 110 for manually opening and closing the BWI 100. Likewise, a BWI 112 representing the BWI 40 includes a vacuum interrupter 114, an actuator 116, a high voltage capacitor 118 and a manual handle 120 for manually opening and closing the BWI 112. The capacitors 106 and 118 are employed to measure the voltage on the cable 34, where the capacitances of the capacitors 106 and 118 are set to provide a known representation of the voltage on the cables 22 and 34, but with an unknown accuracy, such as ±10%. As discussed above, the capacitors 106 and 118 need to be calibrated to more accurately identify the voltage on the cables 22 and 34.

When it is known that the BWIs 100 and 112 are closed, such as at the initial installation of the BWIs 100 and 112, where the voltage on the primary coil 92 is the same as the voltage on the line 122, the controller 96 measures the voltage provided by the secondary coil 94, which will likely not be exactly 120 V, for example, 123 V, referred to herein as the control voltage. In order to calibrate the capacitors 106 and 118 in the manner discussed herein, it is necessary that the voltage measured by the capacitors 106 and 118 is substantially the same as the control voltage. The actual voltage on the capacitors 106 and 118 is then measured when it is known that the BWIs 100 and 112 are closed and a multiplication or calibration factor is determined so that multiplying the calibration factor by the measured voltage from the capacitors 106 and 118 is equal to the control voltage. The capacitors 106 and 118 will likely have different calibration factors even though they are measuring the same voltage on the cables 22 and 34 because of their relative inaccuracies. Thus, during operation of the transformer 90, when it is desired to obtain a voltage measurement at the source side and/or the load side of the transformer 90, the voltage measured at the capacitor 106 and/or 118 is multiplied by the calibration factor for that capacitor to provide an accurate voltage measurement. When the capacitors 106 and 118 are calibrated, over and under voltage limits can be applied to the measured voltages when the BWIs 100 and 112 are open. Thus, the controller 90 can effectively determine that the system has returned to a normal voltage and can be returned to its normal configuration after going through a fault isolation and restoration process. Making decisions about when to open and close the SW's 100 and 112 that involve voltage levels is straightforward because the calibrated voltage on the cables 22 and 34 can be compared to a 120 V base.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:
1. A method for calibrating a capacitor voltage sensor that measures voltage on a power line coupled through a switch to a primary coil of a transformer, the method comprising:
   measuring a control voltage on a secondary coil of the transformer;
   measuring voltage on the capacitor sensor when the switch is known to be closed and the voltage on the primary coil is the same as the voltage on the power line;
   identifying a calibration factor that when multiplied by the measured voltage on the capacitor sensor when the switch is closed makes the measured voltage on the capacitor sensor substantially equal to the control voltage;
   subsequently measuring voltage on the capacitor sensor when the switch is open or closed during operation of the transformer; and multiplying the subsequently measured voltage on the capacitor sensor when the switch is open or closed by the calibration factor to obtain a measured voltage.

2. The method according to claim 1 wherein the power line is at medium voltage.

3. The method according to claim 1 wherein the switch includes a vacuum interrupter.

4. The method according to claim 1 wherein the switch is part of a bushing well interrupter (BWI).

5. The method according to claim 4 wherein the transformer includes two BWIs.

6. The method according to claim 5 wherein the BWIs are controlled by a common control unit.

7. The method according to claim 6 wherein the control unit provides fault detection and restoration.

8. The method according to claim 1 wherein the transformer is one of a series of transformers in a residential loop circuit.

9. A method for calibrating a capacitor voltage sensor that measures voltage on a power line at medium voltage coupled through a bushing well interrupter (BWI) to a primary coil of a transformer that is part of a series of transformers associated with a loop circuit, where each transformer includes a source side BWI and a load side BWI, the method comprising:
  measuring a control voltage on a secondary coil of the transformer;
  measuring voltage on the capacitor sensor when the BWI is known to be closed and the voltage on the primary coil is the same as the voltage on the power line;
  identifying a calibration factor that when multiplied by the measured voltage on the capacitor sensor when the BWI is closed makes the measured voltage on the capacitor sensor substantially equal to the control voltage;
  subsequently measuring voltage on the capacitor sensor when the BWI is open or closed during operation of the transformer; and
  multiplying the subsequently measured voltage on the capacitor sensor when the BWI is open or closed by the calibration factor to obtain a measured voltage.

10. The method according to claim 9 wherein the BWI includes a vacuum interrupter.

11. The method according to claim 9 wherein the two BWI's in the transformer are controlled by a common control unit.

12. The method according to claim 11 wherein the control unit provides fault detection and restoration.

13. A system for calibrating a capacitor voltage sensor that measures voltage on a power line coupled through a switch to a primary coil of a transformer, the system comprising:
  means for measuring a control voltage on a secondary coil of the transformer;
  means for measuring voltage on the capacitor sensor when the switch is known to be closed and the voltage on the primary coil is the same as the voltage on the power line;
  means for identifying a calibration factor that when multiplied by the measured voltage on the capacitor sensor when the switch is closed makes the measured voltage on the capacitor sensor substantially equal to the control voltage;
  means for subsequently measuring voltage on the capacitor sensor when the switch is open or closed during operation of the transformer; and
  means for multiplying the subsequently measured voltage on the capacitor sensor when the switch is open or closed by the calibration factor to obtain a measured voltage.

14. The system according to claim 13 wherein the power line is at medium voltage.

15. The system according to claim 13 wherein the switch includes a vacuum interrupter.

16. The system according to claim 13 wherein the switch is part of a bushing well interrupter (BWI).

17. The system according to claim 16 wherein the transformer includes two BWI's.

18. The system according to claim 17 wherein the BWIs are controlled by a common control unit.

19. The system according to claim 18 wherein the control unit provides fault detection and restoration.

20. The system according to claim 13 wherein the transformer is one of a series of transformers in a residential loop circuit.

* * * * *